(12) United States Patent
Jing et al.

(10) Patent No.: US 10,591,638 B2
(45) Date of Patent: Mar. 17, 2020

(54) INVERSION OF GEOPHYSICAL DATA ON COMPUTER SYSTEM HAVING PARALLEL PROCESSORS

(71) Applicants: Charlie Jing, Houston, TX (US); Dennis E. Willen, Houston, TX (US)

(72) Inventors: Charlie Jing, Houston, TX (US); Dennis E. Willen, Houston, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 1616 days.

(21) Appl. No.: 14/165,326

(22) Filed: Jan. 27, 2014

(65) Prior Publication Data

US 2014/0257780 A1    Sep. 11, 2014

Related U.S. Application Data

(60) Provisional application No. 61/773,495, filed on Mar. 6, 2013.

(51) Int. Cl.
*G06F 11/34* (2006.01)
*G06F 17/50* (2006.01)
*G01V 99/00* (2009.01)
*G01V 3/08* (2006.01)
(Continued)

(52) U.S. Cl.
CPC ........ *G01V 99/005* (2013.01); *G06F 11/3404* (2013.01); *G06F 11/3433* (2013.01); *G06F 17/5009* (2013.01); *G01V 3/081* (2013.01); *G01V 7/00* (2013.01); *G01V 2003/086* (2013.01); *G01V 2210/64* (2013.01); *G06F 9/5027* (2013.01); *G06F 2209/5012* (2013.01);
(Continued)

(58) Field of Classification Search
None
See application file for complete search history.

(56) References Cited

U.S. PATENT DOCUMENTS

| 4,742,305 A | 5/1988 | Stolarczyk |
| 4,792,761 A | 12/1988 | King et al. |
| 4,831,383 A | 5/1989 | Ohnishi et al. |

(Continued)

FOREIGN PATENT DOCUMENTS

| GB | 2 402 745 | 8/2005 |
| GB | 2 410 635 | 12/2006 |

(Continued)

OTHER PUBLICATIONS

Archie, G.E. (1942), "The electrical resistivity log as an aid in determining some reservoir characteristics," *Transactions of the AIME* 146, pp. 54-62.

(Continued)

*Primary Examiner* — Kibrom K Gebresilassie
(74) *Attorney, Agent, or Firm* — ExxonMobil Upstream Research Company-Law Department

(57) ABSTRACT

A method for efficient use of a computing system of parallel processors to perform inversion of geophysical data, or joint inversion of two or more data types. The method includes assigning at least one control processor to control sequence of operations and reduce load imbalance, assigning a group of one or more processors dedicated to updating one or more model parameters, and assigning another group of one or more processors dedicated to forward modeling simulated data.

20 Claims, 4 Drawing Sheets

(51) Int. Cl.
  *G01V 7/00* (2006.01)
  *G06F 9/50* (2006.01)
(52) U.S. Cl.
  CPC ............... *Y02D 10/22* (2018.01); *Y02E 60/76* (2013.01); *Y04S 40/20* (2013.01)

(56) References Cited

U.S. PATENT DOCUMENTS

| | | | |
|---|---|---|---|
| 4,875,015 A | 10/1989 | Ward | |
| 5,050,129 A | 9/1991 | Schultz | |
| 5,175,500 A | 12/1992 | McNeill | |
| 5,189,644 A | 2/1993 | Wood | |
| 5,210,691 A | 5/1993 | Freedman et al. | |
| 5,265,192 A | 11/1993 | McCormack | |
| 5,357,893 A | 10/1994 | Ruffa | |
| 5,373,443 A | 12/1994 | Lee et al. | |
| 5,406,206 A | 4/1995 | Safinya et al. | |
| 5,467,018 A | 11/1995 | Ruter et al. | |
| 5,504,678 A * | 4/1996 | Juszczak | G01V 1/28 702/14 |
| 5,537,319 A | 7/1996 | Schoen | |
| 5,563,513 A | 10/1996 | Tasci et al. | |
| 5,594,343 A | 1/1997 | Clark et al. | |
| 5,657,223 A * | 8/1997 | Juszczak | G01V 1/28 702/14 |
| 5,657,723 A | 8/1997 | Edelmann et al. | |
| 5,706,194 A | 1/1998 | Neff et al. | |
| 5,715,184 A * | 2/1998 | Tyler | G06F 17/5022 703/13 |
| 5,764,515 A | 6/1998 | Guerillot et al. | |
| 5,770,945 A | 6/1998 | Constable | |
| 5,825,188 A | 10/1998 | Montgomery et al. | |
| 5,835,883 A | 11/1998 | Neff et al. | |
| 5,841,733 A | 11/1998 | Bouyoucos et al. | |
| 5,884,227 A | 3/1999 | Rabinovich et al. | |
| 5,905,657 A | 5/1999 | Celniker | |
| 5,991,695 A * | 11/1999 | Wang | G06F 17/16 702/14 |
| 5,995,904 A * | 11/1999 | Willen | G06F 17/10 702/14 |
| 6,037,776 A | 3/2000 | McGlone | |
| 6,049,760 A | 4/2000 | Scott | |
| 6,088,656 A | 7/2000 | Ramakrishnan et al. | |
| 6,094,400 A | 7/2000 | Ikelle | |
| 6,101,448 A | 8/2000 | Ikelle et al. | |
| 6,115,670 A | 9/2000 | Druskin et al. | |
| 6,138,075 A | 10/2000 | Yost | |
| 6,181,138 B1 | 1/2001 | Hagiwara et al. | |
| 6,253,100 B1 | 6/2001 | Zhdanov | |
| 6,253,627 B1 | 7/2001 | Lee et al. | |
| 6,256,587 B1 | 7/2001 | Jericevic et al. | |
| 6,278,948 B1 | 8/2001 | Jorgensen et al. | |
| 6,304,086 B1 | 10/2001 | Minerbo et al. | |
| 6,311,132 B1 | 10/2001 | Rosenquist et al. | |
| 6,332,109 B1 | 12/2001 | Sheard et al. | |
| 6,339,333 B1 | 1/2002 | Kuo | |
| 6,345,240 B1 * | 2/2002 | Havens | G06F 9/5027 700/100 |
| 6,393,363 B1 | 5/2002 | Wilt et al. | |
| 6,424,918 B1 | 7/2002 | Jorgensen et al. | |
| 6,430,507 B1 | 8/2002 | Jorgensen et al. | |
| 6,466,021 B1 | 10/2002 | MacEnany | |
| 6,470,274 B1 | 10/2002 | Mollison et al. | |
| 6,476,609 B1 | 11/2002 | Bittar | |
| 6,493,632 B1 | 12/2002 | Mollison et al. | |
| 6,502,037 B1 * | 12/2002 | Jorgensen | G01V 1/30 702/14 |
| 6,529,833 B2 | 3/2003 | Fanini et al. | |
| 6,533,627 B1 | 3/2003 | Ambs | |
| 6,534,986 B2 | 3/2003 | Nichols | |
| 6,593,746 B2 | 7/2003 | Stolarczyk | |
| 6,594,584 B1 | 7/2003 | Omeragic et al. | |
| 6,671,623 B1 | 12/2003 | Li | |
| 6,675,097 B2 | 1/2004 | Routh et al. | |
| 6,686,736 B2 | 2/2004 | Schoen et al. | |
| 6,711,502 B2 | 3/2004 | Mollison et al. | |
| 6,724,192 B1 | 4/2004 | McGlone | |
| 6,739,165 B1 | 5/2004 | Strack | |
| 6,765,383 B1 | 7/2004 | Barringer | |
| 6,813,566 B2 | 11/2004 | Hartley | |
| 6,816,787 B2 | 11/2004 | Ramamoorthy et al. | |
| 6,842,006 B2 | 1/2005 | Conti et al. | |
| 6,842,400 B2 | 1/2005 | Blanch et al. | |
| 6,846,133 B2 | 1/2005 | Martin et al. | |
| 6,876,725 B2 | 4/2005 | Rashid-Farrokhi et al. | |
| 6,883,452 B1 | 4/2005 | Gieseke | |
| 6,888,623 B2 | 5/2005 | Clements | |
| 6,901,029 B2 | 5/2005 | Raillon et al. | |
| 6,901,333 B2 | 5/2005 | Van Riel et al. | |
| 6,914,433 B2 | 7/2005 | Wright et al. | |
| 6,950,747 B2 | 9/2005 | Byerly | |
| 6,957,708 B2 | 10/2005 | Chemali et al. | |
| 6,958,610 B2 | 10/2005 | Gianzero | |
| 6,985,403 B2 | 1/2006 | Nicholson | |
| 6,993,433 B2 | 1/2006 | Chavarria et al. | |
| 6,999,880 B2 | 2/2006 | Lee | |
| 7,002,349 B2 | 2/2006 | Barringer | |
| 7,002,350 B1 | 2/2006 | Barringer | |
| 7,023,213 B2 | 4/2006 | Nichols | |
| 7,035,525 B2 | 5/2006 | Mittet | |
| 7,062,072 B2 | 6/2006 | Anxionnaz et al. | |
| 7,092,315 B2 | 8/2006 | Olivier | |
| 7,109,717 B2 | 9/2006 | Constable | |
| 7,113,869 B2 | 9/2006 | Xue | |
| 7,114,565 B2 | 10/2006 | Estes et al. | |
| 7,116,108 B2 | 10/2006 | Constable | |
| 7,126,338 B2 | 10/2006 | MacGregor et al. | |
| 7,142,986 B2 | 11/2006 | Moran | |
| 7,187,569 B2 | 3/2007 | Sinha et al. | |
| 7,191,063 B2 | 3/2007 | Tompkins | |
| 7,203,599 B1 | 4/2007 | Strack et al. | |
| 7,227,363 B2 | 6/2007 | Gianzero et al. | |
| 7,250,768 B2 | 7/2007 | Ritter et al. | |
| 7,257,049 B1 | 8/2007 | Laws et al. | |
| 7,262,399 B2 | 8/2007 | Hayashi et al. | |
| 7,262,602 B2 | 8/2007 | Meyer | |
| 7,307,424 B2 | 12/2007 | MacGregor et al. | |
| 7,337,064 B2 | 2/2008 | MacGregor et al. | |
| 7,347,271 B2 | 3/2008 | Ohmer et al. | |
| 7,356,412 B2 | 4/2008 | Tompkins | |
| 7,362,102 B2 | 4/2008 | Andreis | |
| 7,382,135 B2 | 6/2008 | Li et al. | |
| 7,400,977 B2 | 7/2008 | Alumbaugh et al. | |
| 7,411,399 B2 | 8/2008 | Reddig et al. | |
| 7,453,763 B2 | 11/2008 | Johnstad | |
| 7,456,632 B2 | 11/2008 | Johnstad et al. | |
| 7,477,160 B2 | 1/2009 | Lemenager et al. | |
| 7,482,813 B2 | 1/2009 | Constable et al. | |
| 7,502,690 B2 | 3/2009 | Thomsen et al. | |
| 7,536,262 B2 | 5/2009 | Hornbostel et al. | |
| 7,542,851 B2 | 6/2009 | Tompkins | |
| 7,631,168 B1 * | 12/2009 | Muellers | G06F 11/302 712/220 |
| 7,659,721 B2 | 2/2010 | MacGregor et al. | |
| 7,660,188 B2 | 2/2010 | Meldahl | |
| 7,683,625 B2 | 3/2010 | Milne et al. | |
| 7,808,420 B2 * | 10/2010 | Carazzone | G01V 3/12 342/179 |
| 7,822,552 B2 | 10/2010 | Bittleston | |
| 7,884,612 B2 | 2/2011 | Conti et al. | |
| 7,928,732 B2 | 4/2011 | Nichols | |
| 8,008,920 B2 | 8/2011 | Lu et al. | |
| 8,099,239 B2 | 1/2012 | MacGregor et al. | |
| 8,694,299 B2 * | 4/2014 | Krebs | G01V 11/00 702/11 |
| 8,756,042 B2 * | 6/2014 | Tan | G01V 1/282 703/10 |
| 9,367,493 B2 * | 6/2016 | Devins | G06F 15/17 |
| 9,405,564 B2 * | 8/2016 | Muellers | G06F 9/45512 |
| 2002/0082811 A1 | 6/2002 | Honjas et al. | |
| 2002/0172329 A1 | 11/2002 | Rashid-Farrokhi et al. | |
| 2005/0071488 A1 * | 3/2005 | Bilgic | G06F 9/5027 709/230 |

(56) References Cited

U.S. PATENT DOCUMENTS

| | | |
|---|---|---|
| 2005/0128874 A1 | 6/2005 | Herkenhoff et al. |
| 2005/0237063 A1 | 10/2005 | Wight et al. |
| 2006/0186887 A1 | 8/2006 | Strack et al. |
| 2006/0235667 A1 | 10/2006 | Fung et al. |
| 2007/0280047 A1 | 12/2007 | MacGregor et al. |
| 2007/0288211 A1 | 12/2007 | MacGregor et al. |
| 2008/0007265 A1 | 1/2008 | Milne et al. |
| 2008/0008920 A1 | 1/2008 | Alexandrovichserov et al. |
| 2008/0105425 A1 | 5/2008 | MacGregor et al. |
| 2008/0106265 A1 | 5/2008 | Campbell |
| 2008/0184214 A1 | 7/2008 | Archer et al. |
| 2009/0005997 A1 | 1/2009 | Willen |
| 2009/0204330 A1 | 8/2009 | Thomsen et al. |
| 2009/0243613 A1 | 10/2009 | Lu et al. |
| 2009/0306900 A1 | 12/2009 | Jing et al. |
| 2009/0309599 A1 | 12/2009 | Ziolkowski |
| 2010/0179761 A1 | 7/2010 | Burtz et al. |
| 2010/0250642 A1* | 9/2010 | Yellin .......... G06F 11/3409 709/201 |
| 2011/0264423 A1* | 10/2011 | Wienecke .......... G01V 11/00 703/2 |
| 2012/0089382 A1* | 4/2012 | Fisher .......... G06F 9/5083 703/13 |
| 2012/0222044 A1* | 8/2012 | Ding .......... G06F 9/4812 718/106 |
| 2013/0116927 A1* | 5/2013 | DiCaprio .......... G01V 11/00 702/9 |
| 2013/0144579 A1* | 6/2013 | Tetzlaff .......... G06F 17/5009 703/6 |
| 2013/0197810 A1* | 8/2013 | Haas .......... G01V 9/00 702/12 |
| 2013/0198753 A1* | 8/2013 | Hirsch .......... G06F 9/5066 718/104 |
| 2013/0258810 A1* | 10/2013 | Hu .......... G01V 1/303 367/73 |
| 2015/0302122 A1* | 10/2015 | Vold .......... G06F 17/13 703/2 |

FOREIGN PATENT DOCUMENTS

| | | |
|---|---|---|
| WO | WO 1998/07050 | 2/1998 |
| WO | WO 2004/109338 | 12/2004 |
| WO | WO 2006/052145 | 5/2006 |
| WO | WO 2006/073315 | 7/2006 |
| WO | WO 2008/054880 | 5/2008 |
| WO | WO 2008/062024 | 5/2008 |
| WO | WO 2008/066628 | 6/2008 |

OTHER PUBLICATIONS

Chang, H. et al. (1998), "#-d prestack Kirchhoff depth migration: From prototype to production in a massively parallel processor environment," *Geophysics* 63, pp. 546-556.

Commer, M. et al. (2008), "New advances in three-dimensional controlled-source electromagnetic inversion," *Geophysics J. Int.* 172, pp. 513-535.

Gallardo, L.A. et al. (2004), "Joint two-dimensional DC resistivity and seismic travel time inversion with cross-gradients constraints," *J. of Geophysical Research* 109, pp. B03311-03321.

Hou, Z. et al. (2006), "Reservoir-parameter identification using minimum relative entropy-based Bayesian inversion of seismic AVA and marine CSEM data," *Geohysics* 71(6), pp. 077-088.

Hoversten, G.M. et al. (2006), "Direct reservoir parameter estimation using joint inversion of marine seismic AVA and CSEM data," *Geophysics* 71(3), pp. C1-C13.

Jorgensen, G.J. et al. (2000), "Joint 3-D Inversion of Gravity, Magnetic and Tensor Gravity Fields for Imaging Salt Formations in the Deepwater Gulf of Mexico," *Expanded Abstracts*, 79th Annual Int'l. Meeting, Society of Exploration Geophysicists, 3 pgs.

Kern, M. et al. (1994), "Task Level Parallelization for Seismic Modeling and Inversion," No. 2366, INRIA, ISSN 0249-6399, 13 pgs.

Menke, W. (1989), Geophysical Data Analysis: Discrete Inverse Theory, vol. 45, pp. 119-125.

Menke, W. (1989), Geophysical Data Analysis: Discrete Inverse Theory, vol. 45, Chapter 3, pp. 35-37, 52-57.

Tarantola, A. (1987), "Inverse Problem Theory, Methods for Data Fitting and Model Parameter Estimation," Elsevier, pp. 478-484.

* cited by examiner

INVERSION OF GEOPHYSICAL DATA ON COMPUTER SYSTEM HAVING PARALLEL PROCESSORS

CROSS-REFERENCE TO RELATED APPLICATION

This application claims the benefit of U.S. Provisional Patent Application 61/773,495, filed Mar. 6, 2013, entitled Inversion of Geophysical Data on Computer System Having Parallel Processors, the entirety of which is incorporated by reference herein.

FIELD OF THE INVENTION

The subject matter disclosed herein relates generally to the field of hydrocarbon exploration, and more particularly to inversion of geophysical data for hydrocarbon exploration. More specifically, the present techniques relate to an optimized method for inversion, or joint inversion, of geophysical data on a computer system having parallel processors.

BACKGROUND OF THE INVENTION

Geophysicists commonly obtain various types of data from which they infer the presence or absence of hydrocarbons in the subsurface. These data are often separately imaged using techniques, such as migration or inversion, and then jointly interpreted with the aid of a priori information, such as rock physics models.

Various references describe processing approaches to the measured data in the context of a single data type. As an first example, Commer and Newman ("New advances in three-dimensional controlled-source electromagnetic inversion," Geophys, J. Int, 172, 513-535 (2008)) and U.S. Pat. No. 7,808,420 to Carazzone describe solving the problem of inverting controlled-source electromagnetic data for a resistivity model of the subsurface. These references divide a massively-parallel computer into groups of N processors each and decompose the resistivity model by volume among the N processors, the same volume decomposition being replicated on each group. The reference describes further dividing the measured data among the different processor groups so that, using the principle of reciprocity, each group may perform its forward simulation operations (F) independently of the other groups. The processor groups collaborate in updating the resistivity model so that, at the end of an inversion iteration, each group contains the same volume decomposition of the new resistivity model. Commer and Newman further describe the possibility of a load imbalance, where some groups may complete F in advance of other groups and that the load imbalance may change as the iteration progresses. The reference mentions that the solution times for F may be estimated prior to any inversion iterations, but apparently chooses to remedy the load imbalance by ensuring that each group has a similar set of frequencies to simulate, frequency being correlated to the size of the finite difference grid and the grid size being further correlated to the simulation time. In particular, Commer and Newman and Carazzone describe selecting a static, unchanging decomposition of the data among the processor groups and are not concerned by the fact that frequency is an imperfect stand-in for simulation time.

The performance of these methods have certain limitations. For example, numerical experiments with this method have shown significant variations in simulation time between the slowest and fastest processor groups. As an example, with 16 to 24 modern processors assigned to each group and for frequencies in the range of 0.1 to 5 Hz, the performance time periods for F range might range from about 50 seconds to about 2500 seconds. These times range over a factor of 50, with a significant number of times in the range of 1850 seconds. Furthermore, the redundant copying of the resistivity model to all processor groups, as described in these references, decrease the amount of memory available for simulation, which increases N, and thereby decreases the number of simulations that may be carried out concurrently. This problem is even more severe in joint inversions in which more memory is needed to store different types of model parameters. Also, the performance of most pre-conditioning methods used in the forward simulations degrades with increasing N.

As another processing approach involves dynamic load balancing, which involves tasks that are assigned to processor groups based on their availability. This approach has been applied to seismic processing problems, such as 3-D traveltime computation. As noted in U.S. Pat. No. 5,991,695 to Wang and Willen, a massively parallel computer system is divided into groups of processors, each group being used to compute seismic traveltimes in a region of the earth. As each group completes its assigned traveltime computation, it is assigned a new computation task by a control processor, thereby ensuring load balance across all groups and maximizing throughput of the massively parallel computer system. This method of dynamic load balancing may be thought of as a "master-slave" or "leader-worker" model. Also, heterogeneous parallelism, in which different processor groups take on very different tasks, is exemplified, for example, in U.S. Pat. No. 5,657,223. In this reference, processor groups are assigned one of control tasks, input/output tasks, or analysis tasks. This method permits processors to be assigned to tasks in proportion to the amount of computational work and memory requirements associated with each task and permits the computer code associated with each task to be simplified and optimized. In this reference, the input/output and analysis tasks are concerned only with the migration of seismic data and do not address the varying memory and computational requirements associated with jointly inverting multiple types of geophysical data.

In addition to the references that focus on a single data type, other joint inversion references do not appear to address the problems with the larger data sets and resulting processing complexity. As example, Hou et al. ("Reservoir-parameter identification using minimum relative entropy-based Bayesian inversion of seismic AVA and marine CSEM data," Geophysics 71, pp. O77-O88 (2006)) describes a method that specializes to very simple, one-dimensional resistivity and seismic wave velocity models and restricts the use to the simplified seismic problem of Amplitude Variation with Angle or reflectivity inversion. The reference primarily describes the application of the method to the uncertainties in their rock physics model and is not focused on application to large amount of data of inversions in three-dimensional space. Thus, large parallel computers are not needed and the reference is not concerned with the efficient use of such an expensive resource or with the parallelization of three-dimensional problems.

Another example is Gallardo and Meju ("Joint two-dimensional DC resistivity and seismic travel time inversion with cross-gradients constraints," Journ. Geophysical Res. 109, B03311-03321 (2004)), which describes more complicated, two-dimensional earth models for resistivity from DC resistivity data component and seismic velocity from traveltime information in the seismic data component. The reference does not appear to address the underlying rock physics model or problems large enough to involve a massively parallel computer system.

Further, yet another example is described in Jorgensen and Kisabeth ("Joint 3-D inversion of gravity, magnetic, and tensor gravity fields for imaging salt formations in the deepwater Gulf of Mexico," Expanded abstracts, 79th Annual International Meeting, Society of Exploration Geophysicists, 424-426 (2000)). This reference describes three-dimensional earth models of key horizons derived from seismic images using gravity and magnetic data. The reference does not appear to address the underlying rock physics model. The reference appears to restrict the discussion to very simple data types, which require very low level of computational demand in forward simulation, so that they do not require a massively parallel computer system.

Despite the teaching in these references, an efficient implementation of large-scale, joint geophysical inversion on a computer system having parallel processors, such as a massively parallel computer system, is not provided. In particular, is a method of jointly inverting large-scale field data sets on such computer systems in an enhanced manner.

SUMMARY OF THE INVENTION

In one aspect, a method for efficient use of a computing system of parallel processors to update a geophysical model is described. The method may include assigning at least one control processor to control sequence of operations and to reduce load imbalance between the processors, and assigning a first dedicated processor group of one or more processors to update one or more model parameters in the geophysical model; assigning a second dedicated processor group of one or more processors to simulate forward modeling simulated data; and performing an iterative geophysical model optimization, wherein each iteration comprises: using the geophysical model to simulate measurement data; comparing simulated data to measurement data; and updating the geophysical model to lessen misfit based on the comparison.

In one aspect, a computing system of parallel processors programmed to perform iterative geophysical model optimization is described. The computer system comprising: a plurality of processors in communication with each other; memory accessible to the plurality of processor; and a set of instructions, when executed, are configured to: assign at least one control processor, wherein the at least one control processor is configured to control sequence of operations and to reduce load imbalance between the processors, and assign a first dedicated processor group of plurality of processors to update one or more model parameters in the geophysical model; assign a second dedicated processor group of the plurality of processors to simulate forward modeling simulated data; and perform an iterative geophysical model optimization, wherein each iteration comprises: accessing a geophysical model in memory; simulating measurement data; comparing simulated data to measurement data stored in memory; and updating the geophysical model to lessen misfit based on the comparison.

In another aspect, a method of performing a joint geophysical inversion is described. The method may include: a) obtaining at least two types of geophysical data; b) assigning one or more modeling tasks to a first processor group in a computer system, wherein each modeling task is associated with the independent simulation of geophysical data in a region of the subsurface and is associated with at least one processor in the first processor group; c) assigning one or more updating tasks to a second processor group in the computer system, wherein each updating task is associated with the modification of material properties in a geophysical model representing the region of the subsurface; d) assigning one or more control tasks to a third processor group in the computer system, wherein the one or more control tasks direct the sequence of simulations of geophysical data and modification of material properties; e) performing one or more simulations based on the geophysical model and the at least two types of geophysical data; f) updating at least one material property in the geophysical model, wherein the updating is based on comparison of the simulated data and the at least two types of geophysical data.

The method or system may include assigning each processor in the second dedicated processor group to perform an independent simulation of at least a portion of the measurement data, which may be based on one of a spatial parallelization basis; source or receiver location; frequency in the measurement data, and a specific portion of a subsurface region. The assigning the first dedicated processor group may include assigning the first data type processor group to update one or more model parameters in the geophysical model for a first geophysical data type; and assigning the second data type processor group to update one or more model parameters in the geophysical model for a second geophysical data type, wherein second geophysical data type and the second geophysical data type are different geophysical data types.

BRIEF DESCRIPTION OF THE DRAWINGS

The present invention will be better understood by referring to the following detailed description and the attached drawings in which are described in the following paragraphs.

Figure 1:
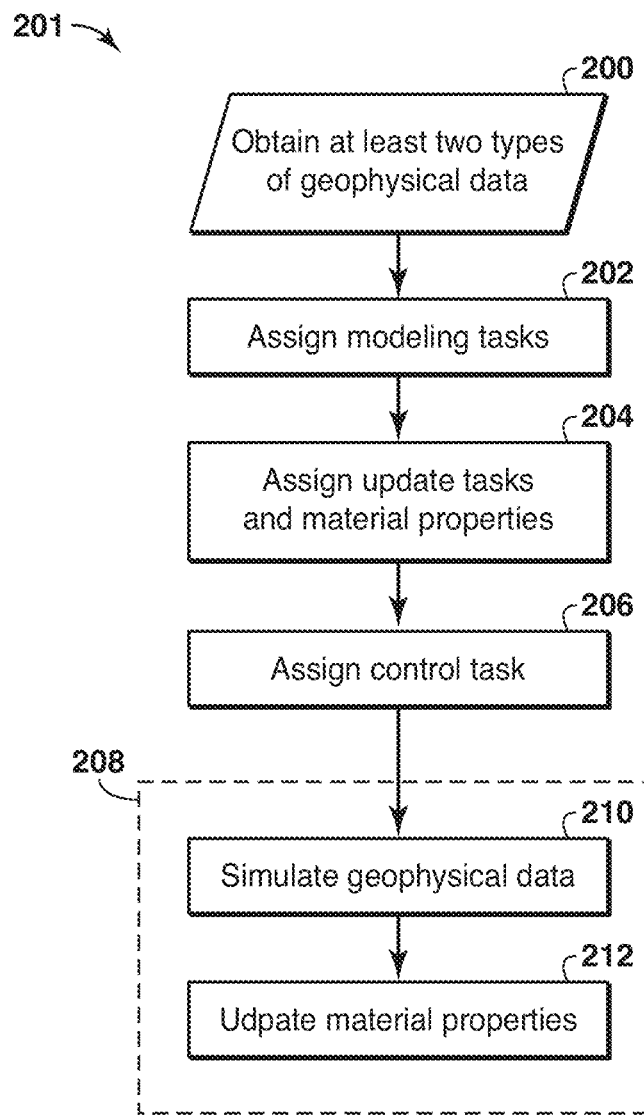
FIG. 1 is a flow chart of an exemplary embodiment of the present techniques.

The present techniques will be described in connection with example embodiments. To the extent that the following description is specific to a particular embodiment or a particular use of the present techniques, this is intended to be illustrative only, and is not to be construed as limiting the scope of the invention. On the contrary, it is intended to cover all alternatives, modifications and equivalents that may be included within the scope of the invention, as defined by the appended claims.

DETAILED DESCRIPTION OF EXAMPLE EMBODIMENTS

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

As discussed in detail below, the disclosed embodiments relate generally to method of solving the problem of optimizing joint geophysical data inversion on a computer system having parallel processor. These computer systems may include a massively parallel computer system, also called a computer system of massively parallel processors. This data may include controlled-source electromagnetics ("CSEM"), seismic data, gravity data, magnetostatic data, and the like.

For example, geophysicists may obtain electromagnetic data in the form of passive-source magnetotelluric measurements, active-source frequency-domain measurements, or active-source time-domain measurements in an effort to probe the resistivity of the subsurface. These measurements are useful because hydrocarbon-saturated rocks are typically more resistive than brine-saturated rocks. Such data may be obtained by various forms of instrumentation measuring electric and/or magnetic fields on the surface, in oceans or lakes, in wellbores, or in aircraft. With active-source measurement data, which is commonly called CSEM, various transmitter configurations may be employed, such as electric or magnetic dipoles in horizontal or vertical configurations.

Geophysicists may also obtain seismic data in the form of passive-source earthquake measurements or controlled-source seismic measurements to probe the mechanical properties of the subsurface. Mechanical properties, such as Lame constants, densities, moduli, and velocities, are of interest because they tend to differ according to rock type (e.g., sandstone, carbonate, shale, salt, or basalt) and, to a lesser extent, according to the type and quantities of fluid or gas entrained within the rock. Such measurements may likewise be carried out with a variety of instruments, including hydrophones, single-component geophones, multi-component geophones and, and for active-source data, a variety of transmitters, such as air guns or vibrators, may be utilized. These instruments may likewise be deployed in wellbores, on land or in bodies of water, such as lakes or oceans.

Geophysicists may obtain gravity data in the form of either vertical gravitational field measurements or full tensor gravity (FTG) gradiometric measurements to more directly probe the density structure of the earth than is possible with seismic data. Gravity measurements are inherently passive-source measurements, which may be obtained with a variety of instruments deployed in wellbores, on land or in bodies of water, or from aircraft.

Geophysicists may obtain magnetostatic data, principally from instruments deployed from aircraft, but also in wellbores, on land or in bodies of water. Magnetostatic data are sensitive to the magnetic permeability of earth structures and, in particular, to ferrous material found in the earth.

In the process of understanding these different data types to infer the presence or absence of hydrocarbons, geophysicists often employ what may be termed a "rock physics model" which may include various material properties. The material properties may include constitutive parameters, petrophysical parameters, and different lithologies, for example. Such models take the form of relationships among constitutive parameters (e.g., resistivity, magnetic permeability, permittivity, velocity, density, and Lame constants) and petrophysical parameters (e.g., salinity, porosity, fluid permeability, and water saturation). The constitutive parameters for the basis for geophysical models of the subsurface and are generally utilized to carry out simulations of different data types, whereas the rock physics model recognizes relationships and correlations among subsurface materials in nature. The rock physics model may be derived from theoretical calculations, laboratory measurements, well logs, empirical relations or some combinations of these sources. See, for example, Archie, G., 1942, The electrical resistivity log as an aid in determining some reservoir characteristics, Transactions of the AIME, 146, pp. 54-62. Constitutive parameters are most generally anisotropic. The rock physics models that are appropriate for different lithologies (e.g., sandstones, shales, carbonates, basalts, etc.), that vary in their degree of sophistication, and/or may be distinguished in different references. Herein, the term "rock physics model" applies to the entire region of interest and may take different forms within that region.

Recent imaging results for electromagnetic data have promoted interest in the joint inversion of multiple data types. Inversion is a procedure for obtaining earth models that are consistent with the measured data. The inversion process thus provides physically meaningful information on rock properties and earth structure. Inversion is typically implemented as an optimization problem in which the mismatch between measured and forward synthesized data is minimized with respect to the earth model used for the forward synthesis. For CSEM data, forward synthesis or forward modeling uses Maxwell's equations to simulate the earth's response for a given set of model parameters and can be described mathematically by, $d=F(m)$, where d is the synthesized electromagnetic data from a given electromagnetic source and m is a model of the earth's resistivity. The operator F thus provides a means to compute d for any given model m. In the inversion process, the mismatch between measured and forward synthesized data is used to update the model m and the process is repeated using the updated model until a satisfactory solution is achieved. In some inversion techniques, such as conjugate gradients, the operator F is also applied in adjoint mode, where the differences between measured and synthetic data are treated as effective sources and their wavefields are backpropagated into the subsurface model as the model update gradient. In addition to the mismatch between measured and synthetic data, the inverse problem usually includes a model regularization term intended to dampen non-physical fluctuations in model m, or to constrain the model m using any prior information about the earth model.

"Joint inversion", as used herein, refers to the inversion of more than one data type to form geophysical models (or images) of the subsurface that are consistent with each other. For example, in a joint inversion using two different types of data, a forward model $d1=F1(m1)$ may be used to simulate electromagnetic data, d1, from an earth resistivity model, m1, while a forward model $d2=F2(m2)$ may be used to simulate P-wave seismic data, d2, from an earth velocity-density model, m2. In joint inversion, both models are subject to a rock physics model, which relates the two models through a relationship written as $G(m1,m2)=0$. Minimizing the mismatch between simulated and measured data for both data types is expected to result in enhanced models than may be obtained from the separate inversion of either data type.

However, several problems arise in attempting to jointly invert geophysical data on modern computers. For example, geophysical data sets vary widely in size. As a specific example, a 3-D gravity or magnetostatic survey may involve a few tens of megabytes of data, whereas a 3-D electromagnetic survey may involve several hundreds of megabytes and a 3-D seismic survey involve one or more terabytes of data. Further, the image models (e.g., image volumes) can be large. In particular, each model parameter type (e.g., different material properties) may involve a gigabyte or more of storage.

In addition to the problems with size of the data sets, the underlying modeling operations, such as operator F, can vary widely from very simple calculations that involve only minimal storage and floating-point operations to complicated algorithms that involve many tens of gigabytes of memory and lengthy run times. In particular, rock physics model related calculations normally have high demand on memory, not on floating operations. Reflectivity inversion of seismic data typically involves comparatively less memory and fewer floating-point operations. Wave-equation inversion of CSEM data typically involves comparatively more memory and floating-point operations. As a result, a massively-parallel computer is frequently utilized to assemble sufficient memory, disk, and arithmetic processing speed to address large-scale joint inversion problems. The different computer resources of memory and disk size, memory bandwidth, and floating-point operations are preferably organized to lessen load imbalance, and thus maximize the overall resource usage efficiency. Load imbalance is a situation where portion(s) of a massively-parallel computer sits idle waiting on tasks to complete in other portion(s) of the machine.

As part of the process, different types of data may also present certain challenges. For example, the inversion of different date types may involve different parallelization schemes for optimal performance. The underlying inversion and modeling operations can usually be parallelized by various techniques or combinations of techniques, such as parallelization over frequency, over offset, over midpoint, over receiver station, and over vector component. The optimal techniques may depend on data type and on the choice of algorithms and should be chosen to avoid load imbalance.

Also, as another example, the underlying modeling operations should be easily modified over time to remove assumptions and include more accurate physics-based details as the computer hardware becomes faster and as more sophisticated techniques become available. That is, the set of instructions or code utilized to operate the method may be modular, which provides flexibility in modifying portions of the method to provide enhancements. Further, the time involved to perform some types of operations cannot be reliably estimated prior to the start of the joint inversion calculation. In particular, electromagnetic simulations are often most reliably formulated as implicit problems, which have to be iterated an unknown number of times until a convergence criteria of the forward electromagnetic field is met or satisfied. Further, the simulation/model-update loop for joint inversion may itself be iterated an unknown number of times to achieve convergence, leading to very long computer run times. This aspect is further complicated by inversions being performed a number of times from different starting models, placing an additional premium on programs designed to be efficient. Preferably, many inversions are performed to quantify the variability or accuracy of each model parameter determined.

The present techniques solve the problem of optimizing joint geophysical data inversion on a computer system having parallel processor, such as a massively parallel computer system, also called a computer system of massively parallel processors. As an example, a method or system for efficient use of a computing system of parallel processors is described. The method may be utilized to perform iterative geophysical model optimization with each iteration involving using the model to simulate survey data (e.g., measurement or geophysical data) followed by comparing simulated to measured survey data and model updating to reduce misfit. To manage the processing operations, the method may include assigning a control processor (e.g., group of control processors) to control a sequence of operations and to reduce load imbalance. Other processors (e.g., dedicated group of updating processors) may be utilized to update model parameters, while other processors (e.g., m dedicated modeling processors) may be utilized to forward modeling simulated data. Among the steps included in control operations may be identifying processors as either modeling or updating, assigning geophysical data simulations to modeling processors, confirming that the geophysical simulations have been performed, instructing updating processors to update model parameters consistent with a rock physics model, evaluating objective functions, and terminating or repeating these steps based on the value of the objective function. Given the values of model parameters, modeling processors may perform the steps of inputting geophysical data, forward data simulation, adjoint simulation, and determining a model gradient. Updating processors may perform the steps of determining a step length along a gradient direction, updating model parameters, storing model parameters on disk or other media, and supplying model parameters to modeling processors.

Further, the method or system may include certain enhancements. For example, the forward modeling in the inversion may include assigning one or more of the processors in the forward modeling processor group based on a spatial parallelization basis, source and/or receiver location basis, or the like. In this manner, each processor may perform independent simulation of geophysical data in an assigned portion of a subsurface region. As another example, model processors may be configured to have each model processor modify one or more model parameters within an assigned portion of a subsurface region. Each model parameter and each image may represent a material property of the subsurface region. As another example, two different types of active source seismic data, such as P-wave data and converted-wave data, time-lapse data, seismic and vertical seismic profile (VSP) data, may be inverted with the present techniques.

In other embodiments, the method may include other enhancements. For example, the method may include jointly optimizing one or more geophysical model(s), with each model corresponding to a different geophysical data type, the joint optimization using geophysical survey data from a survey of each geophysical type. wherein a given individual processor in the forward modeling bank is assigned to one of the data types, and receives as input only a portion of the data and model corresponding to the assigned data type and the assigned portion of the subsurface region. Also, the different types of geophysical data may be from any of active-source seismic, passive source seismic, active source electromagnetic, passive source electromagnetic, gravity and magnetostatic. In addition, at least one control processor may modify a sequence of forward modeling simulations to reduce total simulation time, and/or the comparison of simulated survey data to measured survey data and model updating to reduce misfit may be made consistent with a rock physics model relating physical properties affecting the geophysical data types included in the joint optimization.

Furthermore, a computing system of parallel processors programmed to perform iterative geophysical model optimization, each iteration involving using the model to simulate survey data followed by comparing simulated to measured survey data and model updating to reduce misfit, the system being controlled by an operating program containing program features comprising assigning at least one control processor to control sequence of operations and reduce load imbalance, and using a bank of one or more processors dedicated to updating one or more model parameters and another bank of two or more processors dedicated to forward simulating data.

To further enhance the joint inversion, the system may be configured to handle multiple data types, and to handle multiple material properties and to perform the simulations in order of decreasing run time. As an example, a method of joint geophysical inversion may be performed on a computer system having multiple processing elements (e.g. processors). The method may include the steps of: a) obtaining at least two types of geophysical data from among active-source seismic, passive seismic, active and/or passive electromagnetic, gravity, or magnetostatic data, for example; b) assigning modeling tasks to at least a plurality of the processing elements, each modeling task relating to the independent simulation of geophysical data in a region of the subsurface; c) assigning updating tasks to at least one of the processing elements, each the updating task relating to the modification of material properties in a region of the subsurface; d) assigning to at least one processing element a control task, the control task directing the sequence of simulations of geophysical data and modification of material properties; e) inputting measured geophysical data to the modeling elements, performing the simulations based on a model of the subsurface, and repeating until the required geophysical data have been simulated (e.g., on a first-come-first-serve basis); and f) updating at least one material property in the subsurface model, the update being determined to reduce the misfit between the measured and the simulated geophysical data.

The method may also include various enhancements. For example, the method may include repeating steps (b) through (f) to further reduce the misfit between the measured and the simulated geophysical data. Also, step (d) may include modifying the sequence of simulations to reduce the total simulation time, step (f) may be made consistent with a rock physics model; step (e) may use at least one of finite differences, ray tracing, finite elements, or integral transforms; and/or step (f) may be performed by either stochastic inversion or by conjugate gradient inversion. As a further enhancement, the method may include the steps of h) reacquiring at least one of the geophysical data types; i) subsequently executing steps (b) through (g) for at least two geophysical data types, at least one of which is the reacquired data; and, j) comparing the material properties determined with and without the reacquired data. The benefits of the present techniques are described further in FIGS. 1 to 4.

FIG. 1 is a flow chart 201 showing basic blocks in one embodiment of the present techniques. In this method, an individual processor may be part of a processor group that is associated with one of modeling tasks, updating tasks, and control tasks. The processors are assigned to only one of these tasks. Processors are assigned to groups and are allocated to the respective task with the control processor managing the processor groups. As part of the processing operations (e.g., joint inversion operations), material properties, which are the parameters used to describe the subsurface probed by the measurement data, are adjusted based on the process to provide an enhanced model of the subsurface. This subsurface model may be utilized to analyze the subsurface, and may be utilized to determine the location of hydrocarbons within the subsurface. The use of multiple geophysical data types, which may also include multiple material properties, enhances the processing of the geophysical model. Rock physics calculations, required to ensure that different material properties comprising a subsurface model are consistent, are most naturally carried out as part of the updating tasks.

In block 200, the method begins by obtaining at least two types of geophysical data. The geophysical data types may include controlled-source electromagnetics ("CSEM"), seismic data, gravity data, magnetostatic data and the like. Further, the geophysical data types may be managed to distribute the processing of the data based on regions of the subsurface, source and/or receiver locations, frequencies or other aspects of the geophysical data type to provide concurrent processing of the different portions of the data. As an example, CSEM data may be segmented into different frequencies and/or receiver locations to provide parallel processing as different modeling tasks, but the same data type. At block 202, modeling tasks appropriate to the data are assigned. These modeling tasks may be assigned to processors in a computer system having parallel processors. At block 204, updating tasks and material properties are assigned. This may involve assigning the updating tasks and material properties to other processors, which may include the tasks of storing earth material properties and the responsibility for updating those properties. At block 206, a control task is assigned. The control task manages data flow, model updates, and simulations within the computer system, and is assigned to at least one processor.

Once the various tasks are assigned, the computer system may execute the joint inversion as shown in blocks 208 to block 212. Block 208 includes a joint inversion loop that include simulating geophysical data, as shown in block 210, and updating material property, as shown in block 212. The simulating geophysical data may include controlled-source electromagnetics, seismic data, gravity data, magnetostatic data, and the like. The updating of material properties may include constitutive parameters, petrophysical parameters, and different lithologies, for example. Specifically, these material properties may include resistivity, magnetic permeability, permittivity, velocity, density, Lame constants, salinity, porosity, fluid permeability, and water saturation, etc. The updating of material properties may further account for the constraints and relationships imposed by a rock physics model.

The explicit assignment of modeling tasks to processors provides a mechanism for the aggregation of sufficient memory and processors to perform the modeling tasks, while maximizing the number of modeling tasks that may be carried out concurrently. This assignment also provides a mechanism for dynamic load balancing of the modeling tasks in which the next modeling task is assigned to the next available processor group. The explicit assignment of material properties and the updating tasks provides a mechanism for the aggregation of sufficient memory and processors to store the various earth material properties, and to relate those properties to one another with the rock physics models, which is unique to joint inversion problems. The material property update may be more demanding on memory than on processor computation speed as compared to many of the forward simulations, which have high demand on both memory and processor computing speed. The modeling tasks in joint inversion typically involve a subset of the material properties under consideration and a subset of the geophysical data. A seismic modeling task, for example, does not involve the earth resistivity model and may uses a single shot gather, receiver gathers, or common-midpoint gather from the larger seismic dataset. Furthermore, a modeling task typically involves a partial earth model corresponding to the region probed by its associated data. The separation of tasks for material properties and their updates from that of forward simulation frees the modeling tasks from storing unneeded material properties in their processor memories, thereby reducing the number of processors that have to be dedicated to any one modeling task and increasing the forward simulation efficiency and the number of modeling tasks that can be performed concurrently (e.g., at the substantially the same time for a given number of available processors). The assignment of a specific control task permits the optimal scheduling of modeling and updating tasks. For example, if more data simulations are to be performed than processor groups that are available to perform the modeling tasks, the control task can direct the next simulation to the next available processor group assigned to do modeling tasks. At each iteration of inversion loop 208, the control task may estimate the time required for each simulation and adjust the assignment of simulations to the processor groups carrying out modeling tasks in order to decrease the time required to carry out simulations. If the time required to perform rock physics calculations and material properties updates is small enough relative to the time required for simulations, the control task could be assigned to the same processors as the updating tasks.

In one or more embodiments, further optimizations by reallocating the processors between modeling and updating tasks from time to time may be performed. This reallocation can take place after any iteration of inversion loop, as shown in block 208, when the time periods for modeling and updating tasks are known. A processor allocation based on known performance time period can, in principle, be more efficient than an allocation based on estimates made at the start of the joint inversion.

Beneficially, the present techniques provide a method of analyzing production-scale, 3D seismic, electromagnetic, and other geophysical data sets. That is, the methods that have been developed to address the small-scale, low-dimensional problems, as noted in the references above, fail to address large problems and do not address the efficient deployment of large-scale computing resources. Similarly, other methods developed for large seismic and for large electromagnetic problems do not appear to address the heterogeneity in geophysical data types, forward simulation algorithms, and computational resource requirements of the joint inversion problem and the load-balancing issues associated with it.

Figure 2:
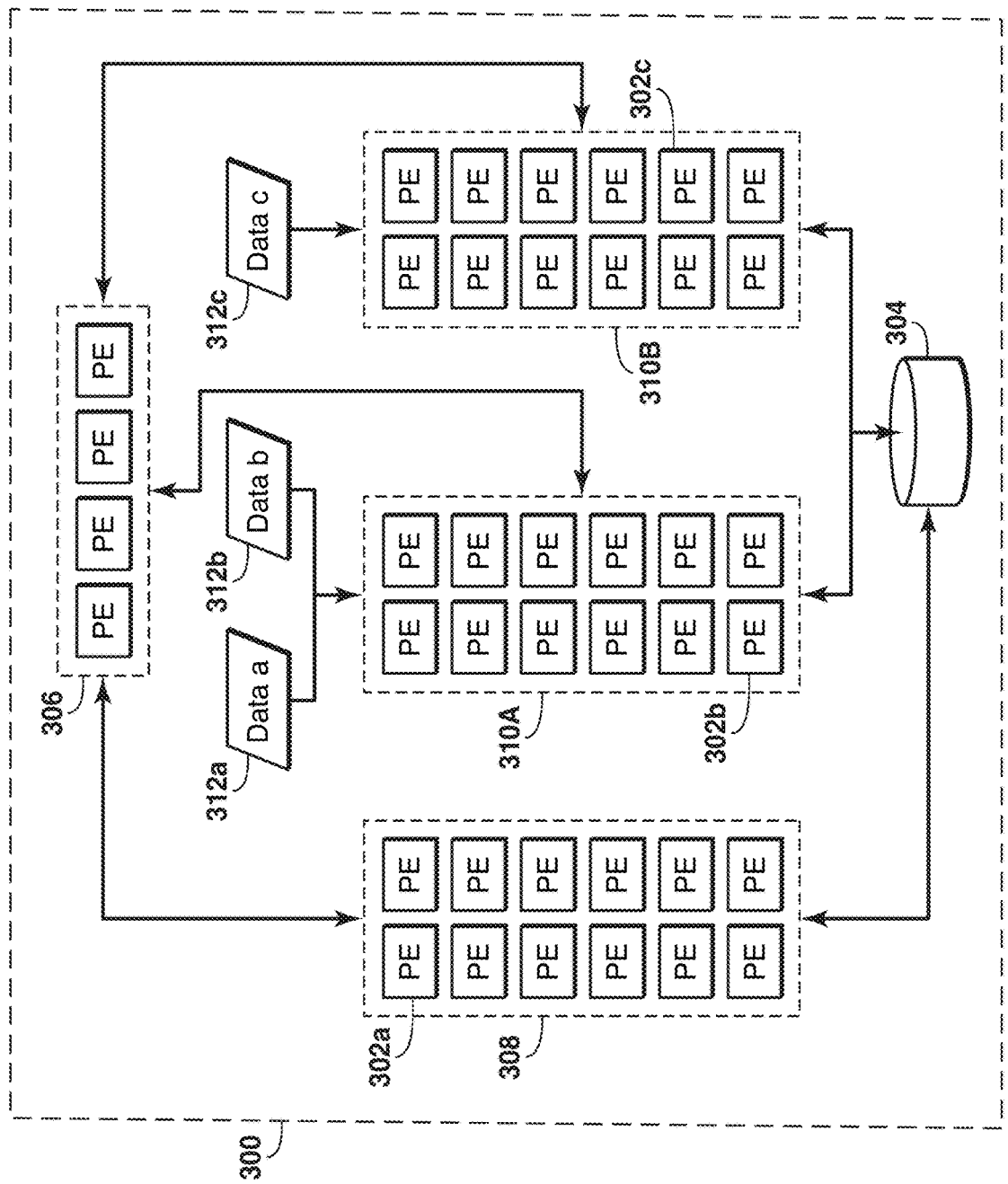
FIG. 2 shows the assignment of resources within a computer system having parallel processors in one exemplary embodiment of the present techniques.

A detailed embodiment of a computer system is illustrated in FIG. 2. In this FIG. 2, the computer system 300, which may be a massively parallel computer system, contains a number of individual processors (sometimes called processing elements or "PEs") 302a, 302b, 302c . . . as well as a disk system 304 that is accessible by all or part of the PEs. At least one PE is assigned to control task 306, some number of PEs are assigned to updating task 308 and the remaining PEs are assigned to modeling tasks 310A, 310B . . . (others not shown), which may be referred to collectively as modeling tasks 310. For large geophysical data sets of interest, the number of forward simulations may often be much larger than the number of processor groups available to perform the modeling tasks. Data items, such as data items 312a, 312b, 312c . . . , which may be referred to collectively as data items 312, represent portions of various geophysical data sets. The various geophysical data sets may include different geophysical data types. For example, data items 312a may include a seismic common-shotpoint or common midpoint gather selected from among several thousand such gathers. Data items 312b may include a common-receiver gather selected from a 3D electromagnetic data set or an ensemble of gravity measurements representing a gravity data set. In performing the inversion loop in block 208 (e.g., executing sets of instructions or code to perform the inversion loop), the control task 306 assigns simulations associated with data item 312 to modeling tasks 310 (e.g., to modeling tasks 310A, modeling tasks 310B, etc.) and to inform the updating task 308 to send the partial model associated with the corresponding simulation to the corresponding modeling tasks 310. The modeling tasks 310 determine partial model updates associated with each of the data items, and convey those partial updates to updating task 308. These updates may be performed by writing the partial updates to disk 304 or by direct message passing (not shown). Updating task 308 reconciles the partial updates against each other and against the rock physics model and updates the earth material properties. The updated material properties are made available to modeling tasks 310 for the next inversion iteration. In alternative implementations, updated material properties may be made available to the modeling tasks 310 by way of disk system 304 or by sending messages (not shown).

The computer system 300 may be programmed by means of message-passing software such as the Message Passing Interface or MPI, available from www.open-mpi.org/or www.lam-mpi.org/, and shared-memory software, such as OpenMP, implemented on C and Fortran compilers available from Intel Corporation, 2200 Mission College Blvd, Santa Clara, Calif., 95054-1549 U.S.A. or from International Business Machines Corporation, New Orchard Road, Armonk, N.Y., 10504. In some cases, it may be advantageous to program the joint inversion application with a combination of message-passing and shared-memory software and to use disk system components (not shown) to store data, models, and updates. For example, shared-memory software may be used among central processing units (CPUs) sharing the same memory subsystem and common memory subsystem and message-passing software among groups of CPUs using different memory subsystems.

In some processing operations, between tens and thousands of modeling tasks may be conducted simultaneously (e.g., the modeling tasks are performed at the same time by different processors or PEs), depending on the number of PEs available, the size of the data sets and the complexity of the simulations. By contrast, the number of simulations to be performed may range from a few thousand to hundred's of thousands. Control task 306 may preferably assign one or more data items 312 to modeling tasks 310 on first-come/first-serve basis to minimize the total time required to carry out the simulations associated with data items 312. As a further refinement, control task 306 may monitor the run times (e.g., performance time periods) associated with each data item 312 and, on subsequent iterations of the inversion loop in block 208, assign data items in order of decreasing runtime. Assigning data items in order of decreasing run time decreases the likelihood that many processors sit idle while a few modeling tasks perform simulations that involve longer performance time periods.

Inversion loop of block 208 and, in particular, update material properties block 212 may be performed by various techniques. One technique may include stochastic methods. In this technique, updating task 308 generates a random update to the material properties and conveys that update to those modeling tasks 310, which are responsible for the appropriate geophysical data type. Collectively, modeling tasks 310 forward synthesize the data items 312, compute partial data-misfit errors corresponding to that data type and convey their respective partial errors to updating task 308. A specific example is provided in equation (1) below $$E_j^i = \frac{1}{N_i} \sum_{k=1}^{N} \frac{(d_k^i - s_k^i)^2}{(w_k^i)^2}. \tag{1}$$

In equation (1), the sum is over all data items that have been assigned to a particular modeling task (e.g., modeling task 310A), including all of the data values within those data items. The variable i denotes that the partial error, $E_j^i$, corresponds to data items and values which correspond to geophysical data type i on modeling task j. The variable $d_k^i$ includes all of the data measurements from items k of type i, $s_k^i$ stands for all of the synthetic data values generated for items k of type i, and the variable $w_k^i$ is a weight factor chosen by the user to place less emphasis on data that are believed to be less reliable. If the data are believed to be equally reliable, $w_k^i$ might be set equal to $d_k^i$ or some other value necessary to make comparable data that vary by orders of magnitude. If the data are composed of a number of vector components, such as data from electromagnetic sensors or shear-wave geophones, $w_k^i$ may be set equal to the amplitude of the vector sum of the components at each measurement location. For magnetotelluric data, $w_k^i$ is often derived from the amount and quality of data available in different frequency bands. The variable $N_i$ is the total number of data values of type i that were assigned to a modeling task (e.g., modeling task 310A). In a stochastic inversion method, updating task 308 further sums the partial errors E according to the equation (2) below:

$$E = \sum_i \lambda_i \sum_j E_j^i. \tag{2}$$

This equation forms a composite error, E, which represents the mismatch between measured and synthetic data, summed over all modeling tasks j and data types i, where each data type has been weighted by a factor $\lambda_i$ to reflect the user's judgment of the relative importance of different data types and to remove any trivial scale factors associated with the different units employed to measure the different data types. In following a stochastic inversion method, updating task 308, then examines whether the composite error was increased or decreased by the random material update and selectively updates the model, for example, by accepting any random update that decreases the composite error and by occasionally accepting a random update that increases the composite error according to some probabilistic method such as the Metropolis algorithm. In other embodiments, updating task 308 may accept sets of random updates according to a genetic algorithm.

The composite error from equation (2) may further contain regularization terms intended to restrict the roughness of the random updates, such as, provided in equation (3):

$$E = \sum_i \lambda_i \sum_j E_j^i + \mu \sum_n |\nabla^2 m_n|; \tag{3}$$

or to restrict their deviation from some a priori notion of model parameters, such as, provided in equation (4):

$$E = \sum_i \lambda_i \sum_j E_j^i + \mu \sum_n |(m_n - m_n^0)^2|. \tag{4}$$

In equations (3) and (4), $m_n$ is the $n^{th}$ model parameter, the $m^0$ are a priori estimates of the model parameters, and $\mu$ is a user-selected parameter to control the strength of the smoothing or a priori terms. Aside from trivial factors associated with the physical units of the various terms, $\mu$ may vary between 0 and 1 in practical applications, with values between 0 and 0.1 preferred. During the course of iterative inversion methods, such as stochastic or conjugate gradient methods, $\mu$ may be gradually decreased to maintain the smoothing or a priori terms in rough balance with the misfit term so that additional, subtle features of the data may be fit even as the material properties converge.

Alternative inversion techniques, such as the conjugate-gradient method, utilize the derivatives of the composite error (e.g., from equations (2), (3), or (4)) with respect to material properties, which naturally lead to expressions containing the derivatives of the data misfit with respect to the material properties. The derivatives of the model regularization term in equation (3) and/or the a priori term in equation (4) can be calculated explicitly and directly. The direct determination of the derivatives of the data misfit is impractical for large-scale problems because it involves the inverting matrices that are millions of elements on a side. Fortunately, these derivatives appear only as dot products of two forward solutions, and it is known, e.g. for the processing of CSEM data, how to invoke the principle of reciprocity to compute the required forward modeling efficiently. See, e.g., G. Newman and D. L. Alumbaugh, "Three-dimensional massively parallel electromagnetic inversion—I," Theory, Geophys J. Int. 128, 345-354 (1997). Specifically, suppose that the data synthesis problem d=F(m) is written as an implicit matrix system, as noted below in equation (5):

$$Kd_s = S \tag{5};$$

where S is the source or signal that gives rise to data $d_s$ and K is a matrix finite difference operator containing information about the material properties, the frequency or time behavior of the signal, and manner in which the earth has been discretized. Then, the required derivative related to data $d_s$ is proportional to the dot product of $d_s$ and another forward solution (normally called the adjoint solution), v, which may be recovered by solving the equation (6) below:

$$Kv = W\delta d_s \tag{6};$$

where $\delta d_s$ is the misfit between the measured and synthetic data, W is the data weighting matrix, and K is the same matrix finite difference operator as that in equation (5). In geophysical problems, linear systems, such as equations (5)

and (6), are commonly solved by iterative methods, such as the biconjugate gradient or quasi-mean residual methods.

Furthermore, it is preferable to assign the forward modeling problem in equation (6) for a particular $d_s$ to the same modeling task 310 that handled problem in equation (5) for that source S. Although not required, this preferred assignment avoids the extra message-passing of material properties that may be needed if the problems in equations (5) and (6) were solved on different modeling tasks for the same region of the earth, and more further, avoids the message-passing between the modeling tasks for performing equations (5) and (6) to calculate the derivative (or gradient), which is the dot product of the two forward solutions.

In this embodiment for gradient-based inversion methods, the modeling tasks perform calculations for both partial errors and model update gradient in the corresponding partial spatial domain and communicate the results to the model updating tasks. The model updating tasks use these results to obtain material properties for the next model update iteration.

Inversion loop of block 208 and update material properties in block 212 may implement the rock physics model either implicitly or explicitly. The rock physics model may be implemented implicitly by adding a term $\beta G(m)$ to either of equations (3) or (4). In this approach, G(m) is a numerical or analytical expression which is identically zero if the rock physics relationship is perfectly satisfied and $\beta$ is a user-defined factor, which accounts for the relative reliability of the rock physics model and any trivial scale differences associated with the units of the terms in equations (3) or (4). By "perfectly satisfied," it is meant that the update to the velocity model is completely consistent with the update to the resistivity model according to the rock-physics model, using joint inversion of seismic and EM data as an example. Aside from the trivial scale differences, rock physics models with high confidence (e.g., such as those determined from first-principles theoretical calculations or from a large number of well logs) may justify values of $\beta$ in the range of 1 to 10. Rock physics models with lower confidence (e.g., such as those derived from a single well log or from a well log tens or hundreds of kilometers away) may justify values of $\beta$ in the range of 0 to 1.

The rock physics model may be implemented explicitly by parameterizing the material properties with variables that are independent and using the rock physics model to compute all dependent variables and their derivatives. For example, Hou et al., which is noted above, describes gas saturation, water saturation, and porosity as fundamental variables within a reservoir zone and uses these to determine velocities, conductivities, and density that are consistent with their rock physics model as part of a stochastic inversion. As another example, Hoversten ("Direct reservoir parameter estimation using joint inversion of marine seismic AVA and CSEM data," Geophysics 71, p. C1-C13 (2006)) uses their rock physics model to compute derivatives of the dependent variables with respect to the independent variables as part of their joint inversion using quadratic programming. These approaches of treating quantities such as gas saturation, water saturation, porosity, shale fraction, etc. as fundamental and computing constitutive properties, such as velocity, density, resistivity, etc. from a rock physics model, may also be used in conjugate gradient inversion techniques.

Both Hou and Hoversten describe that the rock physics model does not have to be invoked over the entire subsurface, but can optionally be applied selectively to a region that is believed to contain hydrocarbons. In this alternative, gas saturation, water saturation, and porosity are considered as fundamental material properties within a purported reservoir layer whereas resistivity, velocity, and density are considered fundamental elsewhere within the subsurface.

All of the rock physics-related calculations connecting material properties and any implicit rock physics constraints are performed preferably by the same processors performing the model updating tasks, where all rock property parameters are accessible for updating and predicting the parameters used by forward simulating different types of data. This allocation of rock physics-related calculations is irrelevant to the detail of the adopted rock physics models.

The optimal number of PEs 302 assigned to model updating task 308 may vary depending upon the total memory required for storing all the necessary rock properties, the model update and rock physics calculations, and the total simulation time on modeling tasks required in one model update iteration. As described above, the total simulation time (e.g., operation time period) of the modeling tasks dominates over the model update and rock physics calculations on the model updating task. Typically, the number of PEs assigned to model updating task 308 may be determined by the memory requirement, and computer nodes of larger memory may be preferably assigned to the model updating task for a non-uniform computer system. Otherwise, the number of PEs in the model updating task 308 should be increased to reduce its calculation time to be less than the total simulation time on the modeling tasks.

The optimal number of PEs 302 assigned to modeling tasks 310 may vary depending upon the type of geophysical data to be simulated, the modeling algorithm used, and the hardware capabilities of the individual PE. For example, a seismic anisotropic elastic simulation may involve considerable more memory and floating-point throughput (number of arithmetic operations that can be carried out within a specific period of time) than isotropic seismic ray-tracing simulation, which may require more resources than a gravity simulation. Furthermore, the memory and floating-point capabilities of commercial PEs increase over time, so that fewer PEs may be required for a given simulation with each succeeding generation of hardware. While no specific number of PEs can be determined in advance, a general strategy is to first reduce the number of PEs to the smallest number with sufficient aggregate memory to carry out the simulation calculation. This strategy minimizes the number of messages that have to be exchanged among PEs within a modeling task and may result in different numbers of PEs assigned to tasks 310A, 310B, . . . . If a single PE is more than adequate to perform one simulation for a particular type, it may be assigned additional simulations to increase its workload up to a level more comparable to the other modeling tasks.

The assignment of PEs (e.g., PEs 302a, 302b, . . . ) to modeling tasks (e.g., modeling tasks 310A, 310B, . . . ) can be dynamically re-arranged to further decrease the overall time period needed for a joint geophysical inversion. For example, gravity-modeling tasks may be performed by individual PEs until the gravity data is exhausted at which point seismic modeling tasks may be performed by small groups of PEs until the seismic data are exhausted.

Finally, larger groups of PEs may then be assembled to carry out low-frequency electromagnetic simulation tasks. This re-assignment of processors within the modeling tasks is much simpler than the re-allocation of processors between modeling and updating tasks. If the relative simulation times for different geophysical data types can be estimated or measured, it is preferable to perform the longest-running simulations (such as electromagnetic simulations) first and the shortest-running simulations (such as gravity simulations) last.

Figure 3:
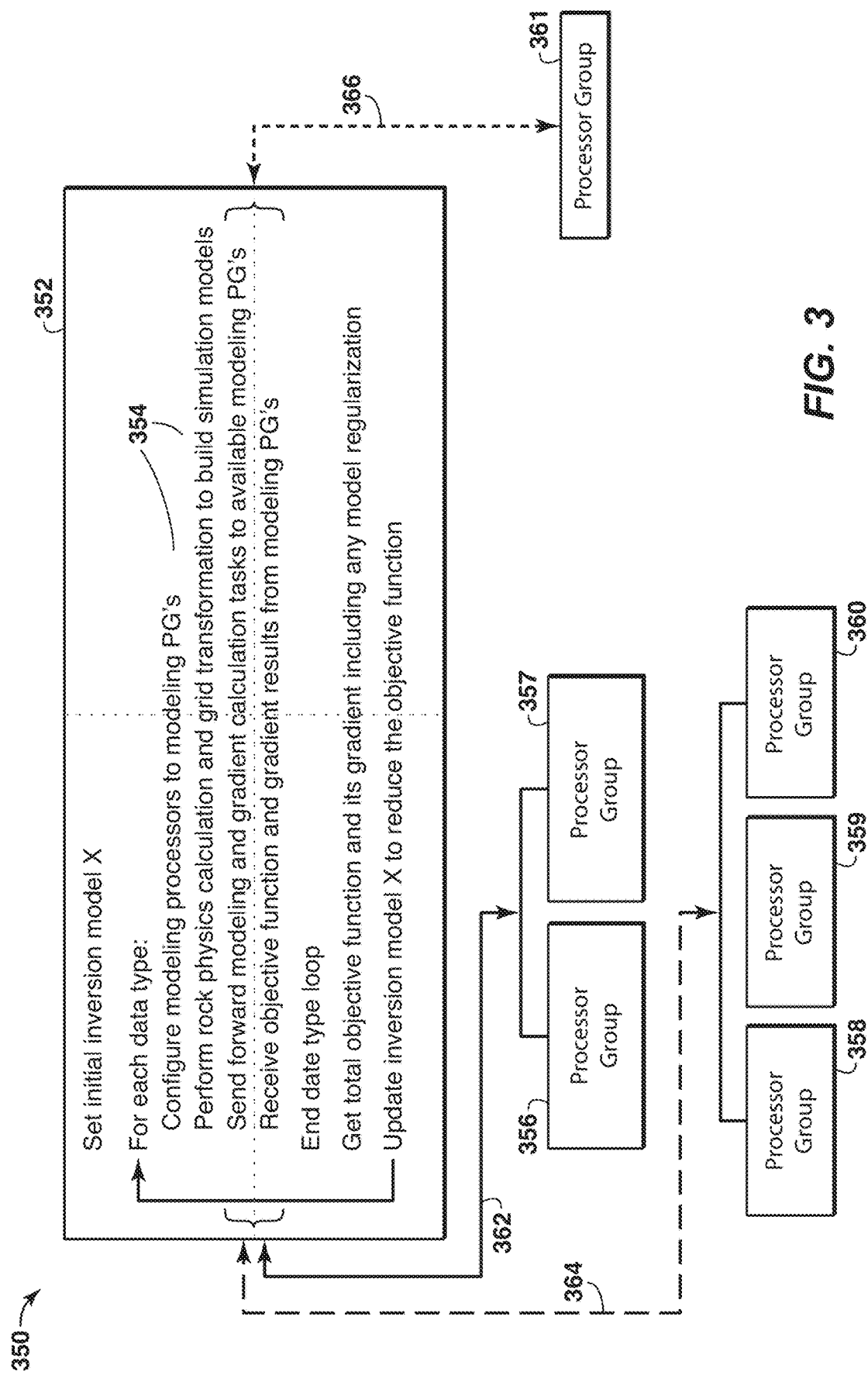
FIG. 3 is a geophysical inversion on an exemplary computer system having parallel processors in another exemplary embodiment of the present techniques.

FIG. 3 illustrates a geophysical inversion on an example computer system having parallel processors in another example embodiment of the present techniques. In this system 350, a set of instructions 354 may be performed on a processor group 352 to process different geophysical data types in an inversion loop, such as the inversion loop of block 208. The different data types may be processed by different modeling processor groups (PGs), such as modeling processor groups 356, 357, 358, 359, 360 and 361. The processor groups may include various processor elements, which are not shown.

As an example, the set of instructions 352 may be executed on the processor group 352 to perform the inversion loop. The set of instructions may be stored on memory (not shown) and accessible by the processor elements in the processor group 352. As a specific example, the set of instructions may include the following steps:

Set initial inversion model X
For each data type:
 Configure modeling processors to modeling PGs
 Perform rock physics calculation and grid transformation to build simulation models
 Send forward modeling and gradient calculation tasks to available modeling PGs
 Receive objective function and gradient results from modeling PGs
End data type loop
Get total objective function and its gradient including any model regularization
Update inversion model X to reduce the objective function.

As indicated from the FIG. 3, these steps involve utilizing the various modeling processor groups 356, 357, 358, 359, 360 and 361 to divide or segment the processing of the different geophysical data types as part of the update of the model X, which is a geophysical model (e.g., a rock physics model of one or more parameters). Specifically, the modeling processor groups 356 and 357 may be utilized to process different portions of a first geophysical data set, as shown by line 362. The modeling processor group 358, 359 and 360 may be utilized to process different portions of a second geophysical data set, as shown by line 364. The modeling processor group 361 may be utilized to process a third geophysical data set, as shown by line 366. While each of these different processor groups are associated with different geophysical data sets that are different types, the modeling processor groups may be regrouped based on the associated modeling requirements for subsequent data sets. For example, processor groups 356 and 357 may be initially assigned simulations of seismic data by ray-tracing; processor groups 358, 359, and 360 may be initially assigned simulations of magnetotelluric data by finite differences, and processor group 361 may be assigned simulation of gravity data by finite elements. Should any of the processor groups 356, 357, or 361 complete their simulations before all magnetotelluric data have been simulated, they may be assigned simulation of additional magnetotelluric data not previously assigned to processor groups 358, 359, or 360.

Figure 4:
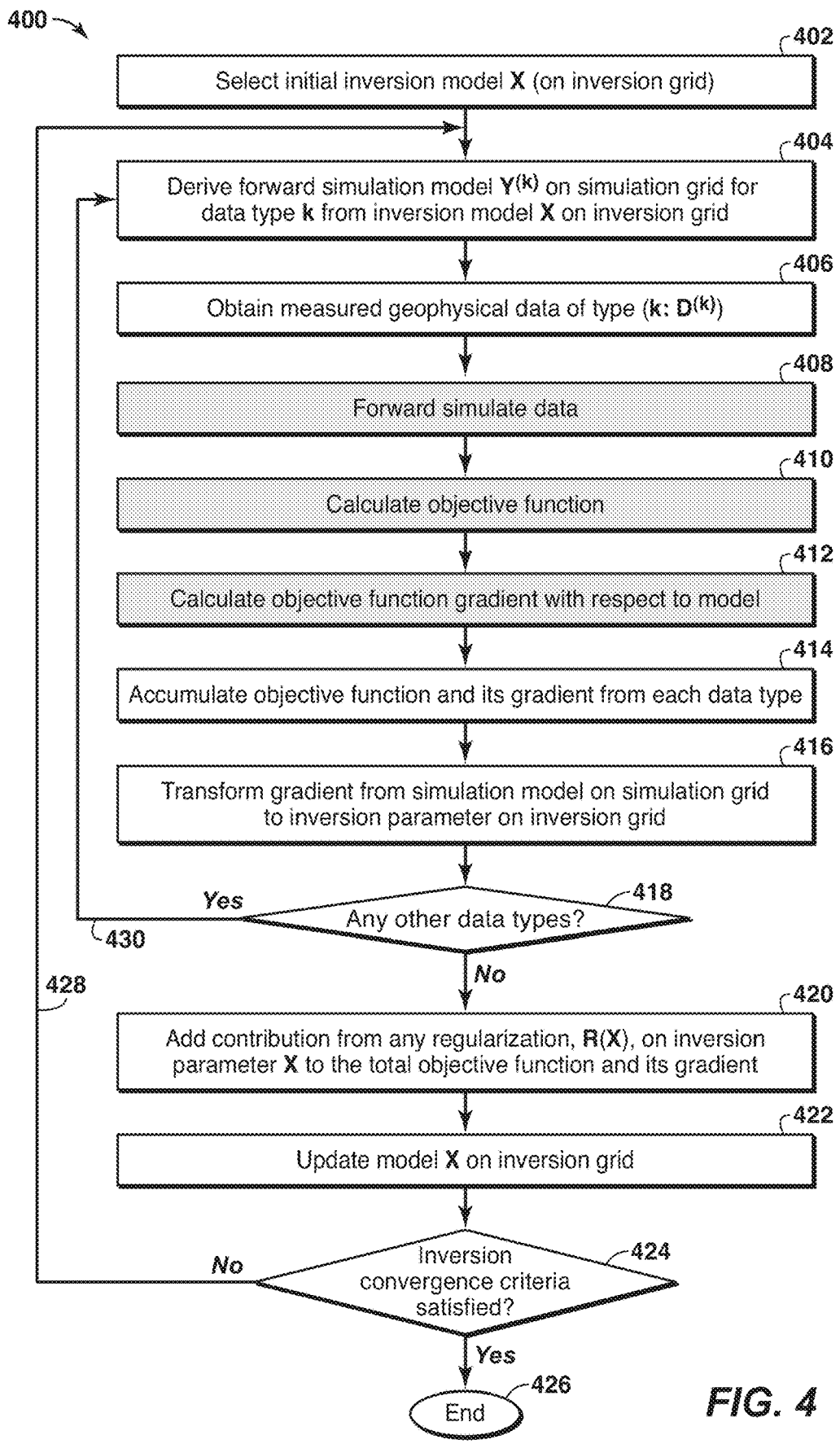
FIG. 4 is a flow chart of another exemplary embodiment of the present techniques.

The inversion loop may include various different configurations to provide the efficient inversion of the different geophysical data sets. As a specific example, FIG. 4 is a flow chart 400 of another exemplary embodiment of the present techniques. In this flow chart 400, the processor groups in the computer system may be configured to efficiently process the different geophysical data types as part of the joint inversion. In this method, the a model update loop 428 may include blocks 404 to 424, while a data type loop 430 may include blocks 404 to 418.

To begin the process, the initial inversion model is selected, as shown in block 402. The selection of the initial inversion model may include determining and setting the total objective function $\psi$ and its gradient $\partial \psi / \partial X$ with respect to model X to zero. This may also include entering the various material properties into the model X.

Once the model is set, the data type loop 428 may be performed in blocks 404 to 418. At block 404, the forward simulation model $Y^{(k)}$ on simulation grid for data type k is derived from inversion model X on inversion grid. This derivation may be represented by equation $Y^{(k)}=U^{(k)}(X)$. Then, at block 406, measured geophysical data of type (e.g., k: $D^{(k)}$) may be obtained. At block 408, the geophysical data may be forward simulated. This simulation may be represented by $S^{(k)}=F^{(k)}(Y^{(k)})$ From the simulation results, the objective function defined by some measure of the data misfit between measured and simulation data may be calculated, as shown in block 410. The calculation may be represented by $\psi^{(k)}=W^{(k)} \| D^{(k)} - S^{(k)} \|^2$. Then, at block 412, the objective function gradient with respect to model is calculated. This calculation may involve calculating $\partial \psi^{(k)} / \partial Y^{(k)}$. Once calculated, the objective function and its gradient from each data type may be accumulated, as shown in block 414. The accumulation may be determined by: $\psi = \psi + \lambda^{(k)} \psi^{(k)}$; $\partial \psi / \partial X = \partial \psi / \partial X + \lambda^{(k)} \partial \omega^{(k)} / \partial X$. Then, the gradient from the simulation model on simulation grid is transformed into an inversion parameter on the inversion grid, as shown in block 416. This transformation may be represented by $\partial \psi^{(k)} / \partial Y^{(k)} \rightarrow \partial \psi^{(k)} / \partial X$. Once this transform is complete, a determination is made whether any other data types are to be processed, as shown in block 418. If more data types are to be processed, the process proceeds to block 404.

However, if the no other data types are to be processed the process proceeds to blocks 420 to 424 as the remaining portion of the model update loop 428. At block 420, the contribution from any regularization, R(X), on model X to the total objective function and its gradient is summed. This summation may be expressed by $\psi = \psi + \beta R(X)$; $\partial \psi / \partial X = \partial \psi / \partial Z + \beta \partial R(X) / \partial X$. Then, the model X is updated on the inversion grid, as shown in block 422. Once the update is complete, a determination is made whether the inversion convergence criteria is satisfied, as shown in block 424. If inversion convergence criteria are not satisfied, the process proceeds to block 402. If the inversion convergence criteria are satisfied, the process ends at block 426.

It is understood that data type loop 430 includes any mathematical details required to represent model parameters and simulate a geophysical data type by means of operator F. For example, it is known that simulating seismic data by finite differences may require that certain relationships be satisfied among the source bandwidth, time step, and spatial sampling of the velocity parameter (e.g., the Cauch-Freidrichs-Levy condition). It is also known that finite-difference simulation of electromagnetic data may be preferentially performed using model parameter grids whose aspect ratios are no larger than about 7:1 (e.g., ratio of 7 to 1). It is further known that magnetotelluric data may be preferentially simulated at lower/higher frequencies using model parameters which are discretized on coarser and/or finer grids.

As another example of an inversion loop, which may be utilized in block 208 or in the flow chart 400, is shown below:

Start iteration of inversion model X
Set both total objective function and its gradient with respect to X to zero: $\psi=0$; $\partial\psi/\partial X=0$;
  Loop over every data type k
    Configure modeling PEs to modeling PE groups for data type k
    Loop over every forward modeling and the corresponding gradient task pair j
      Prepare simulation model Yj(k)(=U(k)(X)), simulation setup, and field data Dj(k) for the task j
      Send information of task j to an available modeling PE group
      Receive available objective function and gradient results from a modeling PE group
      Transform gradient from simulation model on simulation grid to inversion parameter on inversion grid: $\partial\psi j(k)/\partial Yj(k) \rightarrow \partial\psi j(k)/\partial X$
      Accumulate objective function and its gradient: $\psi=\psi+\lambda(k)\psi j(k)$; $\partial\psi/\partial X=\partial\psi/\partial X+\lambda(k)\partial\psi j(k)/\partial X$
    End of loop over all tasks j for data type k
    Perform regularization on parameter Y(k) (if apply): R(k)(Y(k)) and $[\partial R(k)(Y(k))/\partial Y(k)][\partial U(k)(x)/\partial X]$
    Add regularization contribution to the objective function and its gradient: $\psi=\psi+\beta(k)R(k)(Y(k))$; $\partial\psi/\partial X=\partial\psi/\partial X+\beta(k)R(k)[\partial R(k)(Y(k))/\partial Y(k)][\partial u(k)(x)/\partial X]$
  End of loop over data type k
  Perform regularization on inversion parameter X (if apply): R(X) and $\partial R(X)/\partial X$
  Obtain total objective function and its gradient: $\psi=\psi+\beta R(X)$; $\partial\psi/\partial X=\partial\psi/\partial X+\beta\partial R(X)/\partial X$
  If inversion convergence criteria matched then
    Output inversion results
    Inform all PEs to stop
  Else
    Determine and apply inversion model X update
  End of inversion convergence criterion test
End of iteration of inversion model X Beneficially, the present techniques provide a method and system for enhancing joint inversion modeling of geophysical data from two or more geophysical data types. The process may be utilized to overcome, other techniques that involve fixed processor element partitions. The present techniques may be utilized to enhance the inversion steps repeated on the processor element groups (e.g., wasted memory), provide flexibility in managing different geophysical data types, provide modularization of different functionalities (e.g., manage code from different sources) and enhance load balancing of resources within the computer system.

Persons skilled in the technical field will readily recognize that in practical applications of the disclosed methodology, it is partially performed on a computer, typically a suitably programmed digital computer. Further, some portions of the detailed descriptions which follow are presented in terms of procedures, steps, logic blocks, processing and other symbolic representations of operations on data bits within a computer memory. These descriptions and representations are the means used by those skilled in the data processing arts to most effectively convey the substance of their work to others skilled in the art. In the present application, a procedure, step, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "processing" or "computing", "calculating", "determining", "displaying", "copying," "producing," "storing," "adding," "applying," "executing," "maintaining," "updating," "creating," "constructing" "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations herein. This apparatus may be specially constructed for the required purposes, or it may comprise a general-purpose computer selectively activated or reconfigured by a computer program stored in the computer (e.g., one or more sets of instructions). Such a computer program may be stored in a computer readable medium. A computer-readable medium includes any mechanism for storing or transmitting information in a form readable by a machine (e.g., a computer). For example, but not limited to, a computer-readable (e.g., machine-readable) medium includes a machine (e.g., a computer) readable storage medium (e.g., read only memory ("ROM"), random access memory ("RAM"), magnetic disk storage media, optical storage media, flash memory devices, etc.), and a machine (e.g., computer) readable transmission medium (electrical, optical, acoustical or other form of propagated signals (e.g., carrier waves, infrared signals, digital signals, etc.)).

Furthermore, as will be apparent to one of ordinary skill in the relevant art, the modules, features, attributes, methodologies, and other aspects of the invention can be implemented as software, hardware, firmware or any combination of the three. Of course, wherever a component of the present invention is implemented as software, the component can be implemented as a standalone program, as part of a larger program, as a plurality of separate programs, as a statically or dynamically linked library, as a kernel loadable module, as a device driver, and/or in every and any other way known now or in the future to those of skill in the art of computer programming Additionally, the present invention is in no way limited to implementation in any specific operating system or environment.

As an example, a computer system may be utilized and configured to implement one or more of the present aspects. The computer system may include a plurality of processors; memory in communication with the processors; and a set of instructions stored on the memory and accessible by the processors, wherein the set of instructions, when executed, are configured to: assign at least one control processor to control sequence of operations and to reduce load imbalance between the processors, and assign a first dedicated processor group of one or more processors to update one or more model parameters in the geophysical model; assign a second dedicated processor group of one or more processors to simulate forward modeling simulated data; and perform an iterative geophysical model optimization, wherein each iteration comprises: using the geophysical model to simulate measurement data; comparing simulated data to measurement data; and updating the geophysical model to lessen misfit based on the comparison. The set of instructions may, as part of the instructions to assign the first dedicated processor group, assign the first data type processor group to update one or more model parameters in the geophysical model for a first geophysical data type; and assign the second data type processor group to update one or more model parameters in the geophysical model for a second geophysical data type. In certain embodiments, the set of instructions may perform the different aspects in the methods noted above or the algorithm noted above.

In other embodiments, the computer system may include a plurality of processors; memory in communication with the processors; and a set of instructions stored on the memory and accessible by the processors, wherein the set of instructions, when executed, are configured to: a) obtain at least two types of geophysical data; b) assign one or more modeling tasks a first processor group in a computer system, wherein each modeling task is associated with the independent simulation of geophysical data in a region of the subsurface and is associated with at least one processor in the first processor group; c) assign one or more updating tasks to a second processor group in the computer system, wherein each updating task is associated with the modification of material properties in a geophysical model representing the region of the subsurface; d) assign one or more control tasks to a third processor group in the computer system, wherein the one or more control tasks direct the sequence of simulations of geophysical data and modification of material properties; e) perform one or more simulations based on the geophysical model and the at least two types of geophysical data; f) update at least one material property in the geophysical model, wherein the updating is based on comparison of the simulated data and the at least two types of geophysical data.

One or more of the following embodiments in following paragraphs may be utilized with the processes, apparatus, and systems, provided above, to prepare a model and be utilized to produce hydrocarbons:

1. A method for efficient use of a computing system of parallel processors to update a geophysical model, the method comprising: assigning at least one control processor to control sequence of operations and to reduce load imbalance between the processors, and assigning a first dedicated processor group of one or more processors to update one or more model parameters in the geophysical model; assigning a second dedicated processor group of one or more processors to simulate forward modeling simulated data; and performing an iterative geophysical model optimization, wherein each iteration comprises: using the geophysical model to simulate measurement data; comparing simulated data to measurement data; and updating the geophysical model to lessen misfit based on the comparison.

2. The method of paragraph 1, further comprising assigning each processor in the second dedicated processor group to perform an independent simulation of at least a portion of the measurement data.

3. The method of any one of paragraphs 1 to 2, wherein the assigning each processor in the second dedicated processor group is based on a spatial parallelization basis.

4. The method of any one of paragraphs 1 to 2, wherein the assigning each processor in the second dedicated processor group is based on source or receiver location.

5. The method of any one of paragraphs 1 to 2, wherein the assigning each processor in the second dedicated processor group is based on frequency in the measurement data.

6. The method of any one of paragraphs 1 to 2, wherein the assigning each processor in the second dedicated processor group is based on a specific portion of a subsurface region.

7. The method of any one of paragraphs 1 to 6, wherein assigning the first dedicated processor group comprises: assigning the first data type processor group to update one or more model parameters in the geophysical model for a first geophysical data type; and assigning the second data type processor group to update one or more model parameters in the geophysical model for a second geophysical data type.

8. The method of paragraph 7, wherein the first geophysical data type and the second geophysical data type are different geophysical data types.

9. The method of any one of paragraphs 7 to 8, wherein the first geophysical data type and the second geophysical data type are one of controlled-source electromagnetics, seismic data, gravity data, magnetostatic data.

10. The method of any one of paragraphs 1 to 9, wherein each model parameter represents a material property of the subsurface region.

11. The method of paragraph 1, wherein performing an iterative geophysical model optimization further comprises jointly optimizing one or more geophysical model, each model corresponding to a different geophysical data type, and wherein the joint optimization utilizes geophysical measurement data from a survey of each geophysical type.

12. The method of any one of paragraphs 1 to 11, wherein the at least one control processor is configured to modify the sequence of forward modeling simulations to lessen total simulation time.

13. A computer system of parallel processors programmed to perform iterative geophysical model optimization, the computer system comprising: a plurality of processors in communication with each other; memory accessible to the plurality of processor; and a set of instructions which, when executed, are configured to: assign at least one control processor, wherein the at least one control processor is configured to control sequence of operations and to reduce load imbalance between the processors, and assign a first dedicated processor group of plurality of processors to update one or more model parameters in the geophysical model; assign a second dedicated processor group of the plurality of processors to simulate forward modeling simulated data; and perform an iterative geophysical model optimization, wherein each iteration comprises: accessing a geophysical model in memory; simulating measurement data; comparing simulated data to measurement data stored in memory; and updating the geophysical model to lessen misfit based on the comparison.

14. A method of performing a joint geophysical inversion comprising: a) obtaining at least two types of geophysical data; b) assigning one or more modeling tasks a first processor group in a computer system, wherein each modeling task is associated with the independent simulation of geophysical data in a region of the subsurface and is associated with at least one processor in the first processor group; c) assigning one or more updating tasks to a second processor group in the computer system, wherein each updating task is associated with the modification of material properties in a geophysical model representing the region of the subsurface; d) assigning one or more control tasks to a third processor group in the computer system, wherein the one or more control tasks direct the sequence of simulations of geophysical data and modification of material properties;

e) performing one or more simulations based on the geophysical model and the at least two types of geophysical data; f) updating at least one material property in the geophysical model, wherein the updating is based on comparison of the simulated data and the at least two types of geophysical data.

15. The method of paragraph 14, wherein first geophysical data type and the second geophysical data type are each one of controlled-source electromagnetics, seismic data, gravity data, and magnetostatic data.

16. The method of any one of paragraphs 14 to 15, further comprising the step of repeating steps (b) through (f) to further reduce the misfit between the at least two types of geophysical data and the simulated data.

17. The method of any one of paragraphs 14 to 16, wherein step (d) further comprises modifying the sequence of simulations to reduce the total simulation time.

17. The method of any one of paragraphs 14 to 17, wherein step (f) comprises comparing the simulated data with a rock physics model.

18. The method of any one of paragraphs 14 to 18, wherein step (e) performs one or more of finite differences, ray tracing, finite elements, or integral transforms to simulate the data.

19. The method of any one of paragraphs 14 to 19, wherein step (f) is performed by one of stochastic inversion, linearized conjugate gradient inversion, or non-linear conjugate gradient inversion.

The foregoing application is directed to particular embodiments of the present invention for the purpose of illustrating it. It will be apparent, however, to one skilled in the art, that many modifications and variations to the embodiments described herein are possible. All such modifications and variations are intended to be within the scope of the present invention, as defined in the appended claims.

The invention claimed is:

1. A method for efficient use of a computing system of parallel processors to update a geophysical model, the method comprising:
    assigning at least one control processor to control sequence of operations and to reduce load imbalance between the processors, and
    assigning a first dedicated processor group of one or more processors to update one or more model parameters in the geophysical model;
    assigning a second dedicated processor group of one or more processors to simulate forward modeling simulated data; and
    performing an iterative geophysical model optimization, wherein each iteration comprises:
    generating simulated measurement data from the geophysical model with the second dedicated processor group;
    comparing the simulated measurement data to measured data; and
    updating, with the first dedicated processor group, one or more model parameters of the geophysical model to lessen misfit based on the comparing,
    wherein the at least one control processor dynamically balances processing load resulting from the iterative geophysical model optimization across the first dedicated processor group and the second dedicated processor group.

2. The method of claim 1, further comprising assigning each processor in the second dedicated processor group to perform an independent simulation of at least a portion of the measurement data.

3. The method of claim 2, wherein the assigning each processor in the second dedicated processor group is based on a spatial parallelization basis.

4. The method of claim 2, wherein the assigning each processor in the second dedicated processor group is based on source or receiver location.

5. The method of claim 2, wherein the assigning each processor in the second dedicated processor group is based on frequency in the measurement data.

6. The method of claim 2, wherein the assigning each processor in the second dedicated processor group is based on a specific portion of a subsurface region.

7. The method of claim 1, wherein assigning the first dedicated processor group comprises:
    assigning the first data type processor group to update one or more model parameters in the geophysical model for a first geophysical data type; and
    assigning the second data type processor group to update one or more model parameters in the geophysical model for a second geophysical data type.

8. The method of claim 7, wherein the first geophysical data type and the second geophysical data type are different geophysical data types.

9. The method of claim 7, wherein the first geophysical data type and the second geophysical data type are one of controlled-source electromagnetics, seismic data, gravity data, or magnetostatic data.

10. The method of claim 1, wherein the one or more model parameters represents a material property of the subsurface region.

11. The method of claim 1, wherein performing an iterative geophysical model optimization further comprises jointly optimizing one or more geophysical models that each correspond to a different geophysical data type, and wherein the joint optimization utilizes geophysical measurement data from a survey of each geophysical type.

12. The method of claim 1, wherein the at least one control processor is configured to modify the sequence of forward modeling simulations to lessen total simulation time.

13. A computer system of parallel processors programmed to perform iterative geophysical model optimization, the computer system comprising:
    a computer system including at least one control processor in communication with a plurality of processors;
    memory accessible to the at least one control processor and the plurality of processors, wherein the memory includes a geophysical model, measured data, and a set of instructions which, when executed by the computer system causes,
        the at least one control processor to control to control a sequence of operations and reduces load imbalance between the plurality of processors,
        the at least one control processor to assign some of the plurality of processors to a first dedicated processor group that update one or more model parameters in the geophysical model,
        the at least one control processor to assign some of the plurality of processors to a second dedicated processor group that simulate forward modeling of simulated data, and
        the computer system to perform an iterative geophysical model optimization, wherein each iteration includes:
            the first dedicated processor group and the second dedicated processor group accessing the geophysical model in the memory;

the second dedicated processor group simulating measurement data from the geophysical model;

the computer system comparing the simulated measurement data to the measured data stored in the memory, and the first dedicated processor group updating the geophysical model to lessen misfit based on the comparing, wherein the at least one control processor dynamically balances processing load resulting from the iterative geophysical model optimization across the first dedicated processor group and the second dedicated processor group.

14. A method of performing a joint geophysical inversion comprising:
(a) obtaining at least two types of geophysical data;
(b) assigning modeling tasks to a first processor group in a computer system, wherein the modeling tasks is associated with an independent simulation of geophysical data in a subsurface region and is associated with at least one processor in the first processor group;
(c) assigning one or more updating tasks to a second processor group in the computer system, wherein each updating task is associated with a modification of material properties in a geophysical model representing the subsurface region;
(d) assigning one or more control tasks to a third processor group in the computer system, wherein the one or more control tasks direct a sequence of the independent simulations of geophysical data by the first processor group and the modification of material properties by the second processor group;
(e) performing simulations with the first processor group based on the geophysical model and the at least two types of geophysical data;
(f) updating, with the second processor group, at least one material property in the geophysical model, wherein the updating is based on comparison of the simulated data and the at least two types of geophysical data, and the third processor group dynamically balances processing load resulting from the joint geophysical inversion across the first processor group and the second processor group.

15. The method of claim 14, wherein the at least two types of geophysical data include a first geophysical data type and a second geophysical data type that are each one of controlled-source electromagnetics, seismic data, gravity data, or magnetostatic data.

16. The method of claim 14, further comprising the step of repeating steps (b) through (f) to further reduce the misfit between the at least two types of geophysical data and the simulated data.

17. The method of claim 14, wherein step (d) further comprises modifying the sequence of simulations to reduce the total simulation time.

18. The method of claim 14, wherein step (e) performs one or more of finite differences, ray tracing, finite elements, or integral transforms to simulate the data.

19. The method of claim 14, wherein step (f) is performed by one of stochastic inversion, linearized conjugate gradient inversion, or non-linear conjugate gradient inversion.

20. The method of claim 14, wherein step (f) comprises comparing the simulated data with a rock physics model.

* * * * *